United States Patent
Lin

(10) Patent No.: US 6,407,601 B1
(45) Date of Patent: Jun. 18, 2002

(54) DELAY CELL

(75) Inventor: Jung-Chen Lin, Cupertino, CA (US)

(73) Assignee: Kendin Communications, Sunnyvale, CA (US)

( * ) Notice: Subject to any disclaimer, the term of this patent is extended or adjusted under 35 U.S.C. 154(b) by 0 days.

(21) Appl. No.: 09/684,698

(22) Filed: Oct. 10, 2000

Related U.S. Application Data

(62) Division of application No. 09/322,668, filed on May 28, 1999, now Pat. No. 6,204,705.

(51) Int. Cl.$^7$ .................................................. H03L 7/06
(52) U.S. Cl. .................. 327/158; 327/161; 327/264
(58) Field of Search ................................ 327/158, 159, 327/161, 205, 206, 261, 263, 264, 276, 277, 278, 281, 284, 285; 326/85, 87, 88

(56) References Cited

U.S. PATENT DOCUMENTS

| | | | |
|---|---|---|---|
| 5,081,380 A | * 1/1992 | Chen | 327/262 |
| 5,103,116 A | * 4/1992 | Sivilotti et al. | 327/208 |
| 5,121,015 A | * 6/1992 | Ngo | 327/281 |
| 5,231,319 A | * 7/1993 | Crafts et al. | 327/277 |
| 5,267,269 A | 11/1993 | Shih et al. | 375/60 |
| 5,453,709 A | * 9/1995 | Tanimoto et al. | 327/276 |
| 5,459,424 A | * 10/1995 | Hattori | 327/278 |
| 5,576,649 A | * 11/1996 | Foss | 327/111 |
| 5,594,361 A | * 1/1997 | Campbell | 326/24 |
| 5,712,884 A | 1/1998 | Jeong | 375/375 |
| 5,994,934 A | 11/1999 | Yoshimura et al. | 327/158 |
| 6,008,680 A | 12/1999 | Kyles et al. | 327/277 |
| 6,043,695 A | 3/2000 | O'Sullivan | 327/157 |

OTHER PUBLICATIONS

Johnson, Mark G, et al., "A Variable Delay line PLL for CPU—Coprocessor Synchronization" Oct. 1988, pp. 1218–1223, *IEEE Journal of Solid–State Circuits,* vol. 23 No. 5.

Sonntag, Jeff, et al. "A Monolithic CMOS 10MHz DPLL for Burst–Mode Data Retiming", Feb. 16, 1990, pp. 194–195 and 294, 1990 *IEEE International Solid–State Circuits Conference Digest of Technical Papers,* 37$^{th}$ ISSCC, First Edition.

Everitt, James, et al., "A CMOS Transceiver for 10–Mb/s and 100–Mb/s Ethernet," *IEEE Journal of Solid–State Circuits,* vol. 33, No. 12, Dec. 1998, pp. 2169–2177.

\* cited by examiner

*Primary Examiner*—Matthew Smith
*Assistant Examiner*—Paul Dinh
(74) *Attorney, Agent, or Firm*—Fenwick & West, LLP

(57) ABSTRACT

A delay locked loop includes a delay circuit capable of generating an output clock and further capable of generating a GATE signal in response to an aliased condition. A phase detector is coupled to the delay circuit and is capable of comparing a phase difference between a reference clock and the output clock from the delay circuit and generating a pump up signal if the output clock is lagging the reference clock. The phase detector is capable of generating a pump down signal if the output clock is leading the reference clock. A charge pump is coupled to the phase detector and is capable of generating a control voltage for controlling the delay provided to the output clock and capable of pulling up the control voltage in response to the GATE signal. A method of phase locking an output clock with a reference clock includes, checking the occurrence of an aliased condition, increasing the speed of the output clock in response to an aliased condition, and increasing the speed of the output clock if the output clock is lagging the reference clock and decreasing the speed of the output clock if the output clock is leading the reference clock.

3 Claims, 11 Drawing Sheets

Delay Cell

Delay Cell

DELAY CELL

CROSS-REFERENCE TO RELATED APPLICATION

This application is a divisional application of U.S. patent application Ser. No. 09/322,668 filed May 28, 1999, which is now U.S. Pat. No. 6,204,705.

The subject matter of this application is related to the subject matter of the following co-pending U.S. Applications: (1) U.S. application Ser. No. 09/321,903, filed May 28, 1999 by Menping Chang and Hai T. Nguyen, entitled "ADAPTIVE EQUALIZER AND METHOD" which is fully incorporated herein by reference; (2) U.S. application Ser. No. 09/321,983, filed May 28, 1999 by Menping Chang and Vuong Kim Le, entitled "UNIVERSAL OUTPUT DRIVER AND FILTER", now U.S. Pat. No. 6,114,844, which is fully incorporated herein by reference; (3) U.S. application Ser. No. 09/321,938, filed May 28, 1999 by Menping Chang and Hai T. Nguyen, entitled "SELECTIVE SAMPLED PEAK DETECTOR", now U.S. Pat. No. 6,232,802, which is fully incorporated herein by reference; and, (4) U.S. application Ser. No. 09/322,247, filed May 28, 1999 by Hai T. Nguyen and Menping Chang, entitled "BASELINE WANDER COMPENSATION CIRCUIT AND METHOD", now U.S. Pat. No. 6,211,716, which is fully incorporated herein by reference.

FIELD OF THE INVENTION

The present invention relates generally to the field of delay locked loops, and more particularly to a delay locked loop with an improved shunt-capacitor delay cell and with a capability to compensate for aliased signals.

BACKGROUND OF THE INVENTION

Conventional delay locked loops (DLLs) include delay cells with topologies that are based on either the "current-starved" approach or on the shunt-capacitor approach, as described below and in Mark Johnson and Edwin Hudson, *A Variable Delay Line PLL for CPU-Coprocessor Synchronization*, IEEE Journal of Solid State Circuits, Volume 23, No. 5, pp. 1218–1223 (October 1988). FIG. 1a is a schematic circuit diagram of a conventional delay cell 100 that employs the current-starved approach. Specifically, the delay cell 100 includes an inverter 105 formed by transistors 107 and 109, a current mirror formed by the p-channel transistors 110 and 115, and n-channel transistors 120 and 125. The value of a control signal "Vcontrol" determines the current flow in the n-channel transistor 120 and the n-channel transistor 125. At lower values for Vcontrol, the current flow in the n-channel transistor 125 (or n-channel transistor 120) is low. As the value of Vcontrol increases, the current in the n-channel transistor 125 increases. A low current value provided by n-channel transistor 125 limits the value of $I_{DS(109)}$ which is the drain-to-source current of n-channel transistor 109. As the $I_{DS(109)}$ value decreases, the switching speed of inverter 105 decreases, thereby adding delay when generating the output signal $V_{out}$ from the input signal $V_{in}$. In order to increase the delay provide by the current-starved delay element 100 to the input signal $V_{in}$, the value of control signal Vcontrol is, therefore, decreased.

Conversely, as the $I_{DS(109)}$ value increases, the switching speed of inverter 105 increases, thereby decreasing the delay when generating the output signal $V_{out}$ from the input signal $V_{in}$. In order to decrease the delay provided by delay element 100 to the input signal $V_{in}$, the value of control signal Vcontrol is, therefore, increased.

One disadvantage of the current-starved approach is that the current values must be precise and that the devices must match in the current-starved delay element 100. Furthermore, if a short delay is to be provided to the input signal $V_{in}$ by the delay element 100, then the operating current typically has a high value. In addition, to compensate for process, temperature, and voltage supply variations, the sizes of the current mirrors, which consist of the p-channel transistors 110 and 115 and the n-channel transistors 120 and 125 in delay cell 100, are large in value. These characteristics disadvantageously lead to high power requirements and large die sizes. Other drawbacks for the delay cell 100 include low immunity to noise and the requirement of precise wiring to minimize noise interference. For example, conductors are preferably not crossed in the delay cell 100 in order to decrease noise interference.

FIG. 1b is a schematic circuit diagram of a conventional delay cells 150 that employs the shunt capacitor approach. Specifically, the delay cell 150 includes an inverter 160, an n-channel transistor 165 coupled to the inverter 160 output, and a capacitor 170 coupled the n-channel transistor 165. The inverter 160 receives the input signal $V_{in}$ and generates the output signal $V_{out}$. The delay cell 150 also includes an inverter 175, an n-channel transistor 180 coupled to the inverter 175 output, and a capacitor 185 coupled to the n-channel transistor 180.

The control signal Vcontrol controls the amount of resistance provided by the n-channel transistors 165 and 180. If, for example, the control signal Vcontrol is at a low level, then the resistance provided by the n-channel resistor 165 between the node 190 and the capacitor 170 is at a high value. An open circuit is effectively present between the node 190 and the capacitor 170, and the capacitor 170 is, therefore, not coupled as a capacitive load to the inverter 160 output. Therefore, the switching speed of inverter 160 is at a faster rate, thereby decreasing the delay of the input signal $V_{in}$.

If, however, the control signal Vcontrol is at a high level, then the resistance provided by the n-channel resistor 165 between the node 190 and the capacitor 170 is at a lower value. The n-channel transistor 165, therefore, allows the node 190 to be coupled to the capacitor 170. Since the capacitor 170 acts as a capacitive load on the inverter 160 output, the switching speed of inverter 160 is at a slower rate. Thus, the delay is increased. for the input signal $V_{in}$.

However, the effectiveness of the delay control provided by the n-channel transistor 165 (or n-channel transistor 180) is limited for the following reason. Due to the body-effect, the threshold-voltage required for turning on the n-channel transistor 165 (or n-channel transistor 180) may rise to, for example, 1.0 volts to 1.2 volts. A further disadvantage of the shunt-capacitor based delay cell in FIG. 1b is that if the capacitor 170 (or capacitor 185) is implemented by a p-type device, the capacitor 170 will be referenced to the positive voltage source VDD instead of the ground voltage VSS. a result, when the output signal $V_{out}$ is switching from a low level to a high level, the capacitor 170 will be bootstrapped above the VDD level, and this condition may cause a soft breakdown for the capacitor 170. Therefore, there is a need for an improved delay cell that overcomes the aforementioned problems of conventional approaches.

Conventional delay locked loops also include phase detectors that are commonly unable to distinguish aliased signals from fundamental signals. An aliased signal occurs when the feedback clock signal in the delay locked loop is lagging a reference clock signal (received by the DLL) by more than one cycle and may often cause the DLL to lock to an inappropriate edge of the reference clock signal Refclk. Therefore, there is a need for a delay locked loop that can compensate for aliased signals, thereby leading to improved DLL performance.

SUMMARY OF THE INVENTION

The present invention provides a delay locked loop including a delay circuit capable of generating an output clock signal and further capable of generating a GATE signal in response to an aliased condition. A phase detector is coupled to the delay circuit and is capable of comparing a phase difference between a reference clock signal and the output clock signal from the delay circuit and generating a pump up signal if the output clock signal is lagging the reference clock signal. The phase detector is capable of generating a pump down signal if the output clock signal is leading the reference clock signal. A charge pump is coupled to the phase detector and is capable of generating a control voltage for controlling the delay provided to the output clock signal and capable of pulling up the control voltage in response to the GATE signal to increase the speed of the output clock signal.

In addition to overcoming the disadvantages of conventional approaches, the present invention can detect the occurrence of aliased signals and-accordingly provide a delay locked loop with an improved phase locking capability. The present invention can also advantageously be implemented by use of a single polycrystalline CMOS process which is a relatively inexpensive and accurate process.

The phase detector in the delay locked loop further provides symmetrical output signals for pumping up or pumping down the charge pump. Furthermore, the phase detector has good resolution, since the overlap between the pump up signal and the pump down signal from the charge pump permits detection of phase differences of as low as approximately fifty (50) pico-seconds. Furthermore, the phase detector can continuously determine phase differences between reference clock signal and the output clock signal, and as a result, the phase detector avoids the "dead zone" problem commonly encountered in conventional peak detectors.

The delay locked loop in accordance with the present invention also provides a delay cell that can operate under low power supply (e.g., less than 2 volts) and that may be implemented in a small die size.

DETAILED DESCRIPTION OF THE PREFERRED EMBODIMENTS

Figure 2:
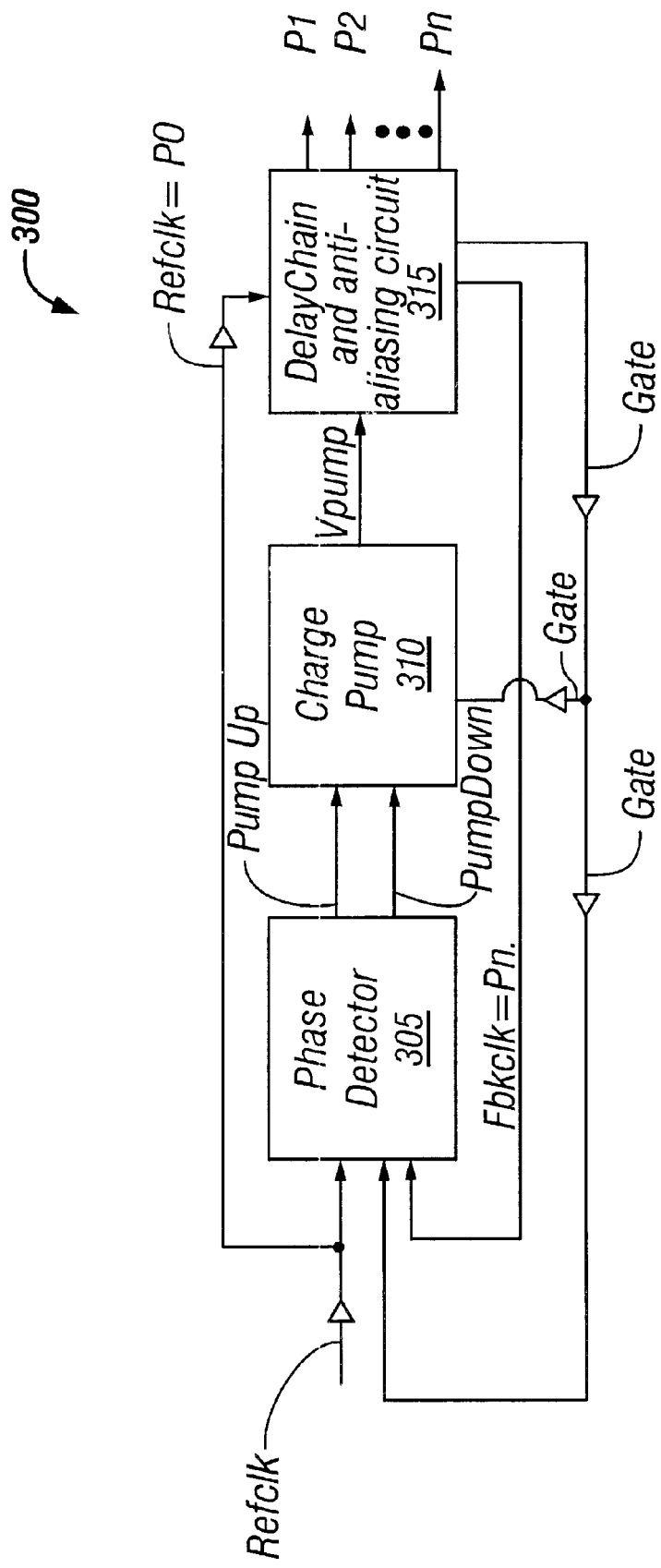
FIG. 2 is a block diagram of a delay locked loop in accordance with an embodiment of the present invention.

Referring now to FIG. 2, there is shown a schematic block diagram of a delay locked loop (DLL) 300 in accordance with an embodiment of the present invention. The DLL 300 includes a phase detector 305, a charge pump 310, and a delay chain and anti-aliasing circuit 315. One of the functions of the DLL 300 is to provide a fixed phase relationship between a reference clock signal "Refclk" and a feedback clock signal "Fbkclk" which is the output clock signal generated by the delay chain and anti-aliasing circuit 315. The phases of the reference clock signal Refclk and the feedback clock signal Fbkclk are made equal by adjusting the delay provided by the delay chain and antialiasing.circuit 315. Additionally, each delay cell 700(1) to 700(4) (FIG. 12) generates an output-clock signal with an associated phase value. As a result, multiple signals with different phases may be generated by the delay chain and anti-aliasing circuit 315.

As described in further detail below, the delay locked loop 300 can also detect and compensate for aliased signals. As an additional feature, the delay locked loop 300 can operate under a low power range and can be implemented in a small die size.

Figure 3A:
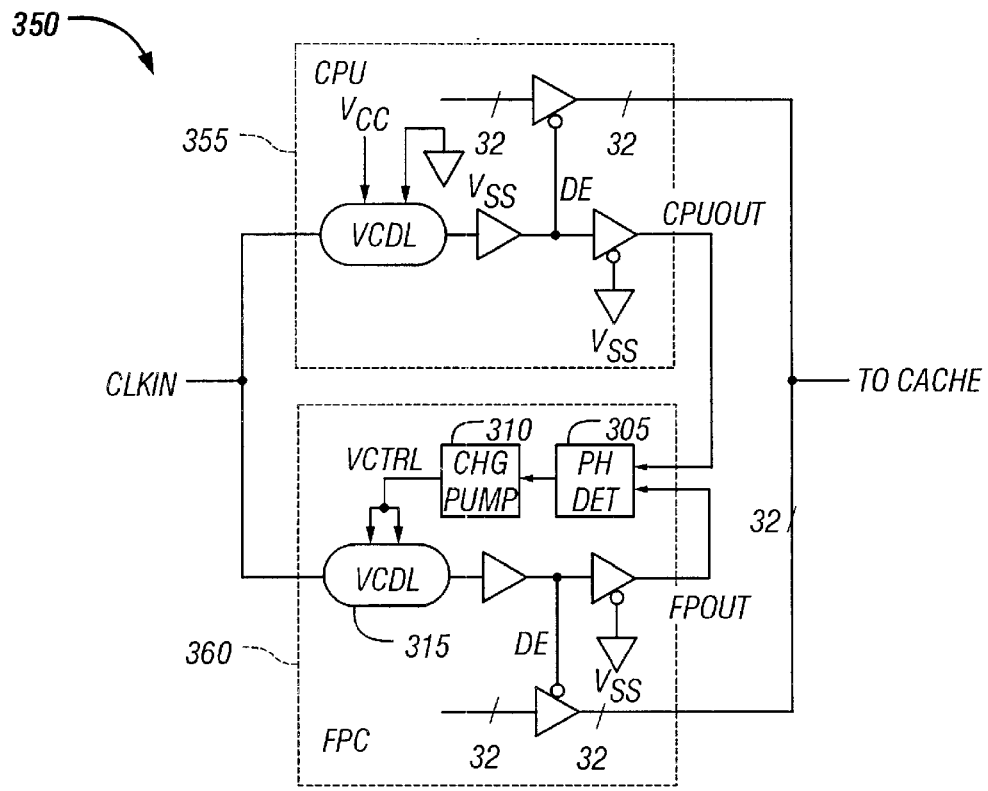
FIG. 3a is a block diagram of a system-that incorporates a delay locked loop in accordance with the present invention.

The delay locked loop 300 may be used to provide a fixed phase relationship for-signals used in a digital system 350 as shown in FIG. 3a. The digital system 350 includes a central processing unit (CPU) 355 and a floating point co-processor (FPC) 360. The central processing unit 355 and the floating point co-processor 360 both receive an input clock signal CLKIN, while the central processing unit 355 outputs a clock signal CPUOUT and the floating point co-processor 360 outputs a clock signal FPOUT. A zero (0) degrees phase difference may be achieved between the clock signals CPU-OUT and FPOUT by the use of the delay locked loop 300 which includes the phase detector 305, the charge pump 310 and the delay chain and anti-aliasing circuit 315 (or voltage control delay line VCDL) in accordance with the present invention.

Figure 3B:
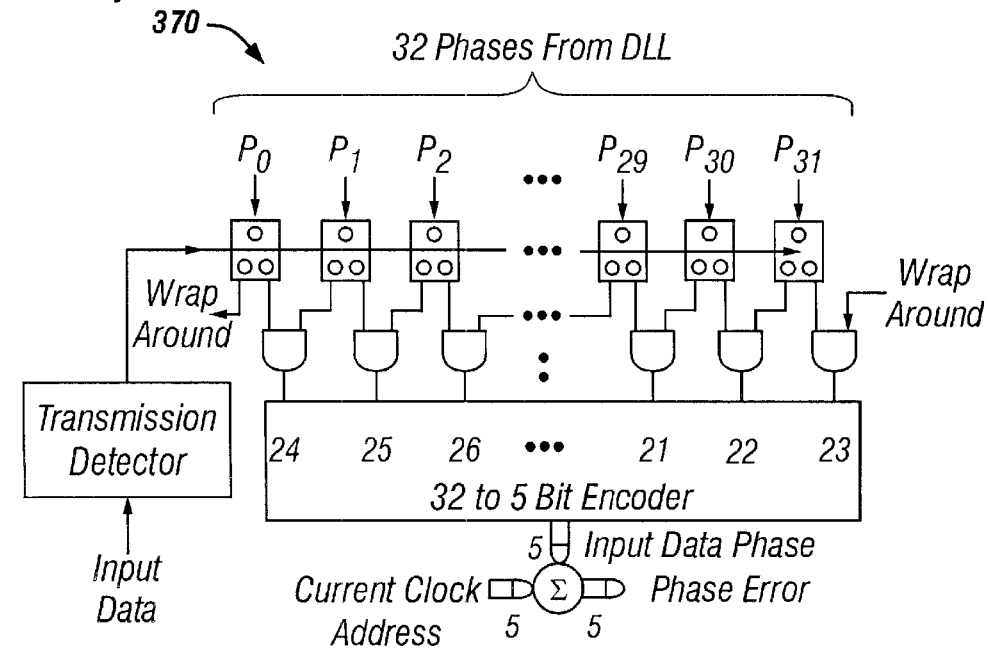
FIG. 3b is a block diagram of a data recovery system that may utilize the present invention.

The delay locked loop 300 may also be used to. provide multiple phase clock signals for a data recovery system 370, as shown in FIG. 3b. The thirty-two (32) phases P0, P1, . . . P31 may be generated by the delay chain and anti-aliasing circuit 315 of delay locked loop 300 and received by the data recovery system 370. The various phase values P0, P1, . . . P31 may be obtained from the various delay cell outputs in the delay chain and anti-aliasing circuit 315.

Figure 4:
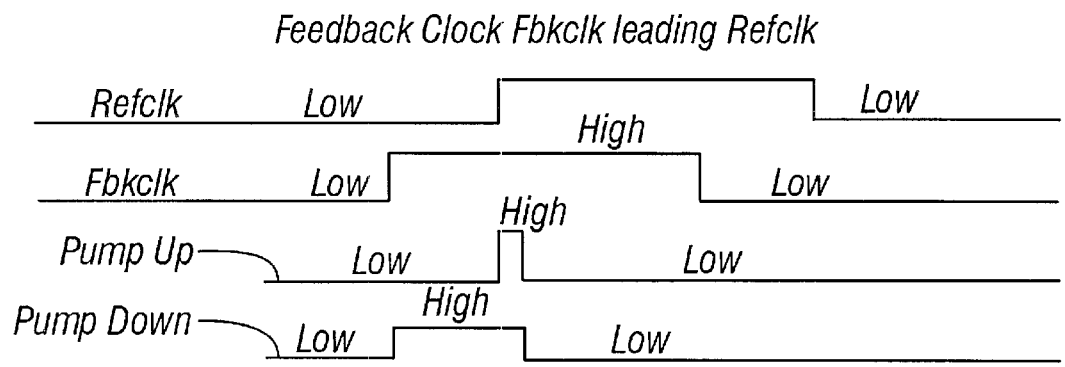
FIG. 4 is a timing diagram illustrating a condition of a feedback clock signal Fbkclk leading a reference clock signal Refclk.

Reference is now made to FIGS. 2, 4, 5 and 6 for discussion of the functionality of the delay locked loop 300. The phase detector 305 compares the phase of the reference clock signal Refclk with the phase of the feedback clock signal Fbkclk. If the feedback clock signal Fbkclk is leading the reference clock signal Refclk, as shown in FIG. 4, then the phase detector 305 outputs a "PUMP DOWN" signal (FIG. 2) to decrease the value of the output control voltage Vpump from the charge pump 310. The decreased output voltage Vpump value is received by the delay chain and anti-aliasing circuit 315, and causes the circuit 315 to increase the delay of the feedback clock signal Fbkclk.

Figure 6:
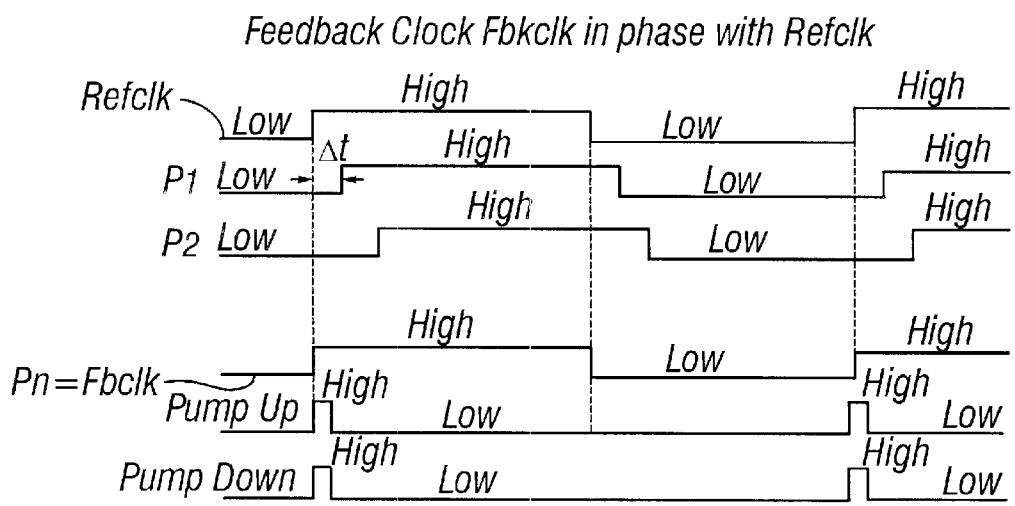
FIG. 6 is a timing diagram illustrating a condition of a feedback clock signal Fbkclk in phase with a reference clock signal Refclk.

The phase detector 305 continues to compare the phase of the feedback clock signal Fbkclk with the phase of the reference clock signal Refclk and will continue to output the PUMP DOWN signal for increasing the delay of the feedback clock signal Fbkclk if the feedback clock signal Fbkclk continues to lead the reference clock signal Refclk. When the phase of the feedback clock signal Fbkclk matches the phase of the reference clock signal Refclk, then the phase matched condition of FIG. 6 is attained. Under this condition, the PUMP UP signal is the same as the PUMP DOWN signal. The charge pump output voltage Vpump will not change. The lock condition will remain.

Figure 5:
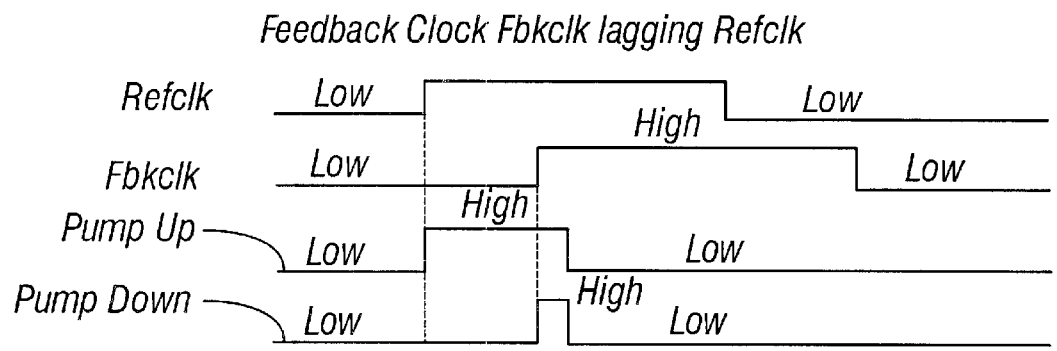
FIG. 5 is a timing diagram illustrating a condition of a feedback clock signal Fbkclk lagging a reference clock signal Refclk.

If the feedback clock signal Fbkclk is lagging the reference clock signal Refclk, as shown in FIG. 5, then the phase detector 305 outputs a "PUMP UP" signal (FIG. 2) to increase the value of the output control voltage Vpump from the charge pump 310. The increased output voltage Vpump value is received by the delay chain and anti-aliasing circuit 3i5, and causes the circuit 315 to decrease the delay of the feedback clock signal Fbkclk.

The phase detector 305 continues to compare the phase of the feedback clock signal Fbkclk with the phase of the reference clock signal.Refclk and will continue to output the PUMP UP signal for decreasing the delay of the feedback clock signal Fbkclk if the feedback clock signal Fbkclk continues to lag the reference clock signal Refclk. When the phase of the feedback clock signal Fbkclk matches the phase of the reference clock signal Refclk, then the phase matched condition of FIG. 6 is attained, and the delay locked loop 300 then locks the phase of the feedback clock signal Fbkclk.

Figure 7:
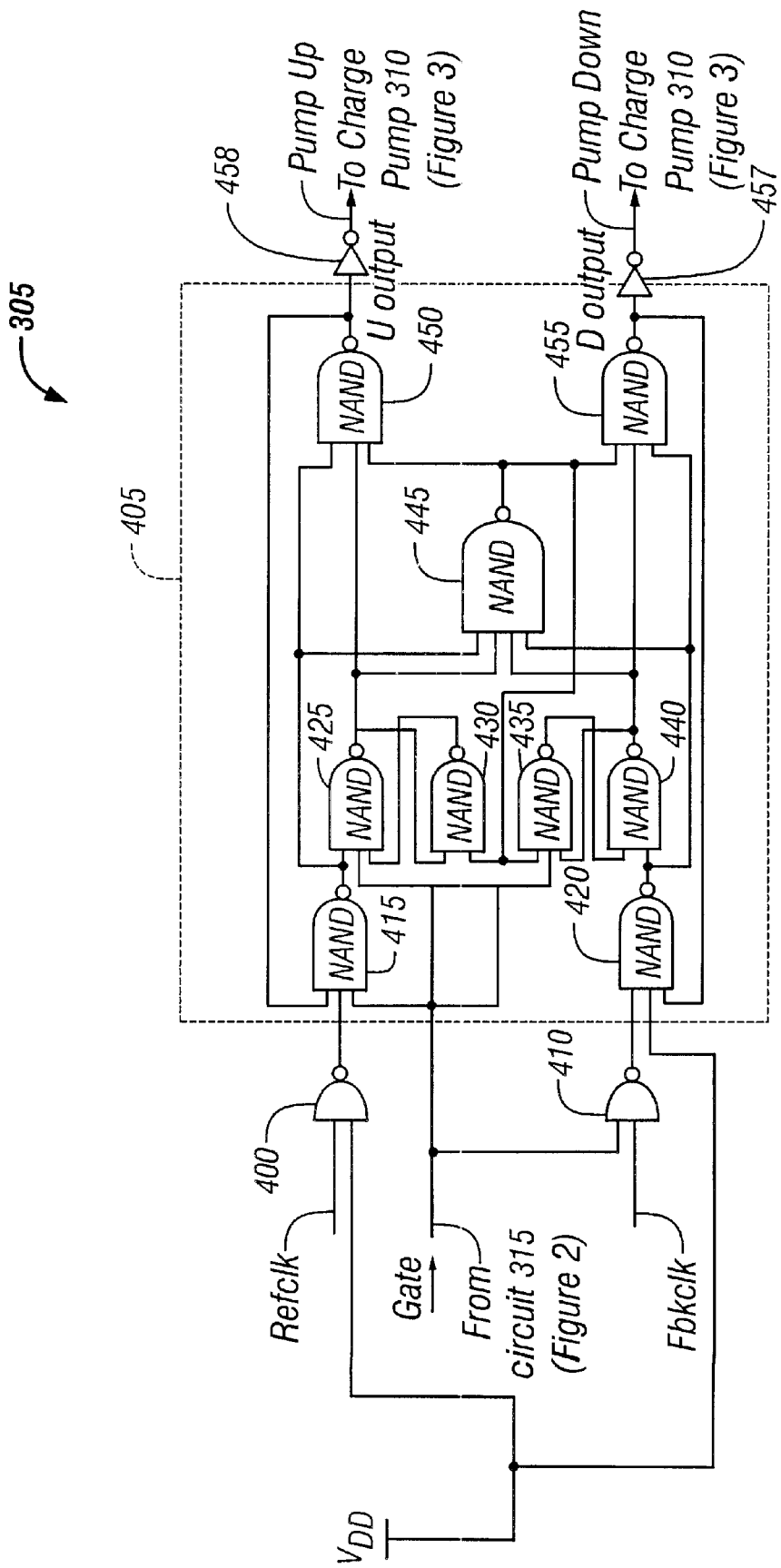
FIG. 7 is a block diagram of an embodiment of the phase detector in FIG. 2.

FIG. 7 shows a schematic circuit diagram of the phase detector 305 in accordance with an embodiment of the present invention. A NAND gate 400 is configured to receive the reference-clock signal Refclk and the VDD voltage signal, while a NAND gate 410 is configured to receive the feedback clock signal Fbkclk and the GATE signal generated by the delay chain and anti-aliasing circuit 315. A NAND gate stage 405 includes NAND gates 415–455 wherein the NAND gate 415 receives the outputs of NAND gates 400 and 450 and the GATE signal from the delay chain and anti-aliasing circuit 315. The NAND gate 420 receives the outputs of NAND gates 410 and 455 and the VDD voltage signal. The NAND gate 450 generates, via inverter 458, the PUMP UP signal for input into the charge pump 310 (FIG. 2), while the NAND gate 455 is coupled to an inverter 457 which generates the PUMP DOWN signal for input into the charge pump 310.

Figure 8:
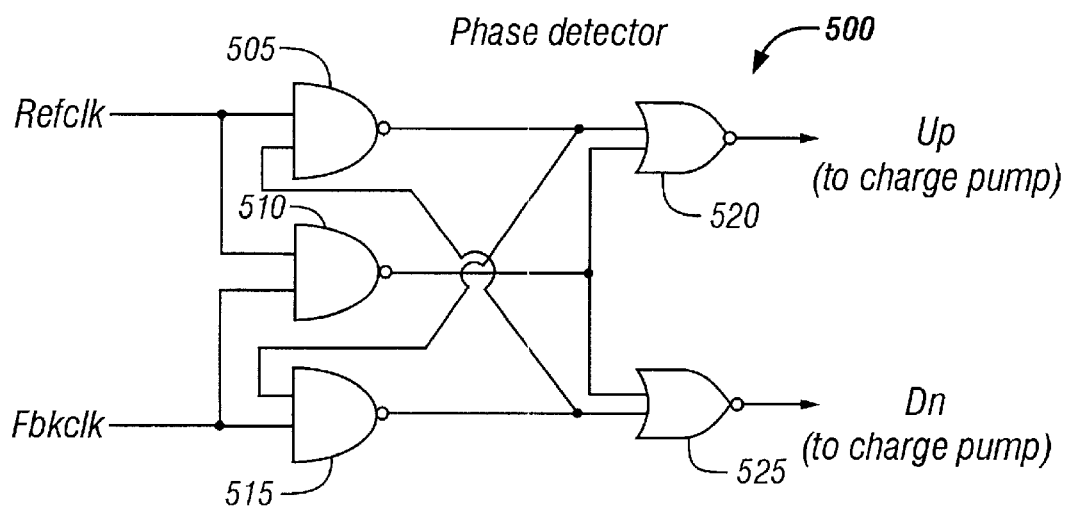
FIG. 8 is a block diagram of a conventional phase detector.

FIG. 8 is a block diagram of a conventional phase detector 500 that includes NAND gates 505, 510 and 515 and NOR gates 520 and 525. The NAND gate 505 receives a reference clock signal Refclk, while the NAND gate 515 receives a feedback clock signal Fbkclk generated from a conventional delay chain (not shown). Based on the phase difference between the reference clock signal Refclk and the feedback clock signal Fbkclk, the NOR gates 520 and 525 generate the pump up signal "UP" and the pump down signal "DN", respectively, to a conventional charge pump (not shown) to adjust the phase of the feedback clock signal Fbkclk.

Figure 9:
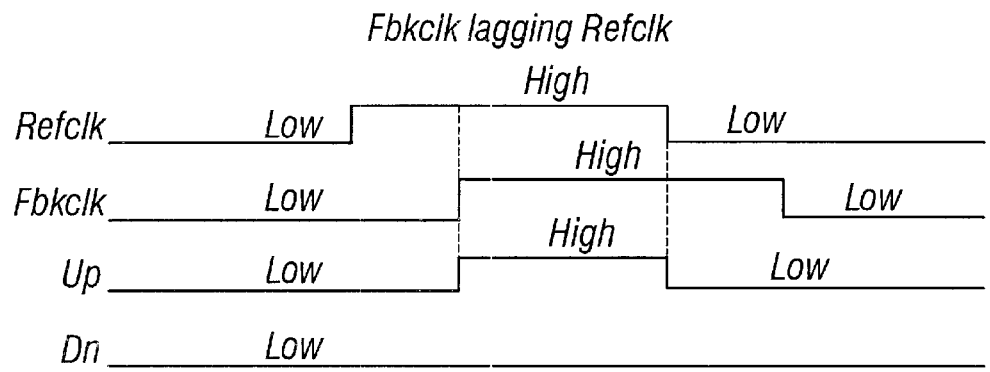
FIG. 9 is a timing diagram illustrating a condition of a feedback clock signal Fbkclk (detected. by the phase detector in FIG. 8) lagging a reference clock signal Refclk.
Figure 10:
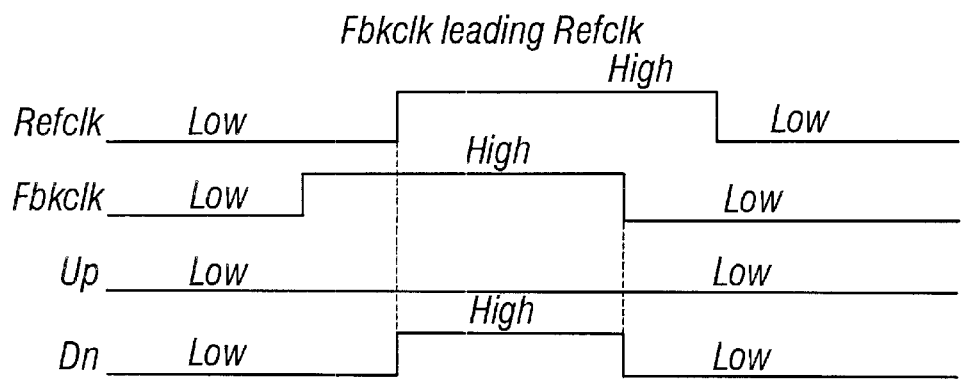
FIG. 10 is a timing diagram illustrating a condition of a feedback clock signal Fbkclk (detected by the phase detector in FIG. 8) leading a reference clock signal Refclk.

FIG. 9 illustrates a timing diagram for the conventional phase detector 500 if the feedback clock signal Fbkclk is lagging the reference clock signal Refclk. In contrast, FIG. 10 illustrates a timing diagram for the convention phase detector 500 if the feedback clock signal Fbkclk is leading the reference clock signal Refclk.

The conventional phase detector 500 of FIG. 8 includes the following disadvantages. First, the phase detector 500 may possibly lock into aliased phases, thereby not permitting data recovery. Second, the phase detector 500 has poor resolution. In particular, the pump up signal UP and the pump down signal DN each has a limited pulse width that can be resolved by the phase. detector 500. This limitation results in a "dead zone" in the transfer function of the phase detector 500 wherein the dead zone is a range of phase differences in response to which the phase detector 500 does not produce any output signal. As a result, the conventional phase detector 500 is commonly limited to low frequency applications.

Figure 11:
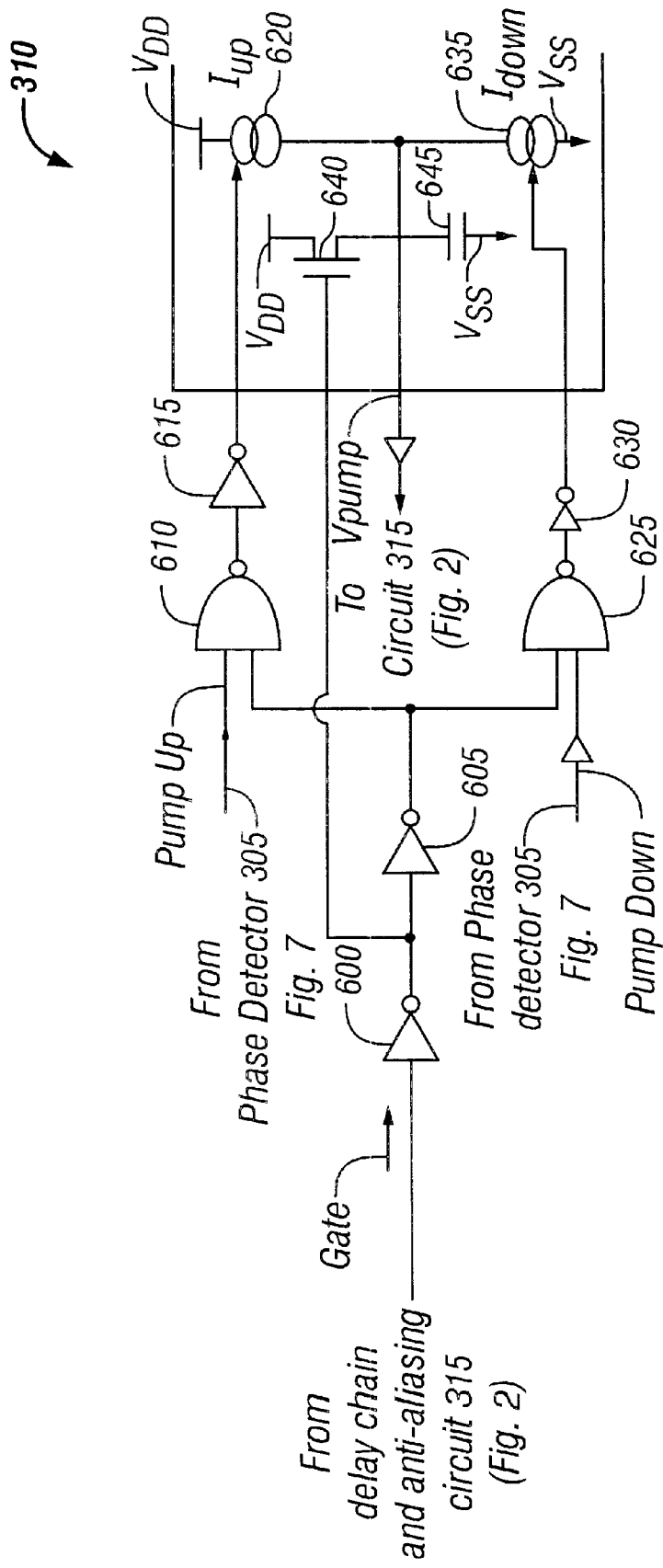
FIG. 11 is a schematic circuit diagram of an embodiment of the charge pump in FIG. 2.

FIG. 11 is a schematic circuit diagram of a charge pump 310 in accordance with an embodiment of the present invention. The charge pump 310 includes an inverter 600 that receives the GATE signal from the delay chain and antialiasing circuit 315 and an inverter 605, coupled to the inverter 600. A NAND gate 610 receives the PUMP UP signal from the phase detector 305 (FIG. 2) and has an output coupled to an inverter 615. The output of inverter 615 is coupled to a current source 620 for increasing the voltage value of the control voltage Vpump. The charge pump 310 also includes a NAND gate 625 for receiving the PUMP DOWN signal from the phase detector 305 (FIG. 2), and has an output coupled to an inverter 630. The output of inverter 630 is coupled to a current source 635 for decreasing the Vpump voltage value. The operation of the charge pump 310 is further described below (with reference to FIGS. 14a–14c) during the following conditions: (1) if the feedback clock signal Fbkclk is leading the reference clock signal Refclk, (2) if the feedback clock signal Fbkclk is lagging the reference clock signal Refclk, and (3) if an alias condition occurs.

Figure 12:
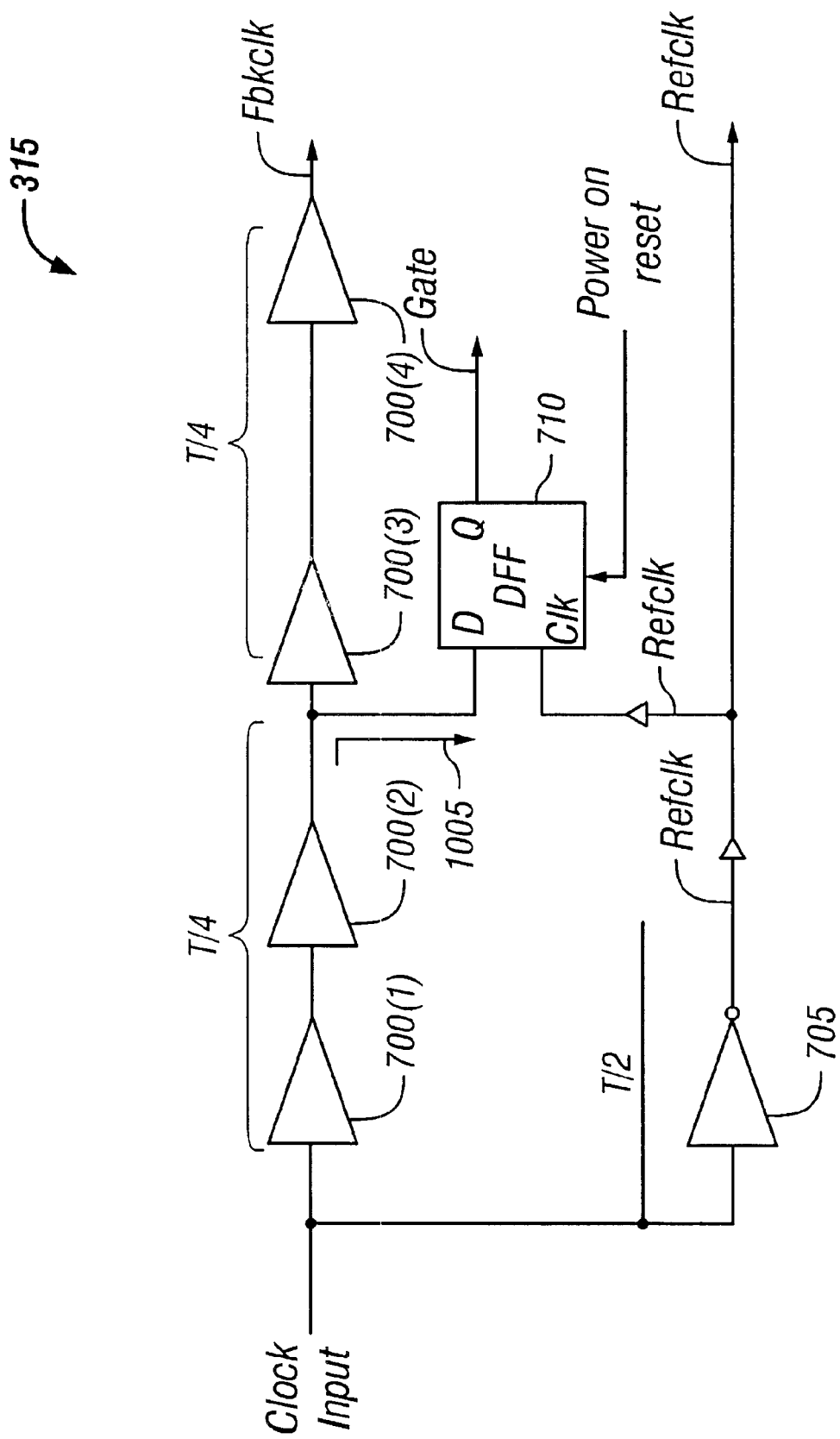
FIG. 12 is a block diagram of an embodiment of the delay chain and anti-aliasing circuit in FIG. 2.

FIG. 12 is a schematic block diagram of a delay chain and anti-aliasing circuit 315 in accordance with an embodiment of the present invention. The delay chain and anti-aliasing circuit 315 includes delay elements (cells) 700(1), 700(2), 700(3) , and 700(4). However, the delay chain and anti-aliasing circuit 315 may alternatively be implemented with additional delay elements. In another alternative embodiment, the delay chain and anti-aliasing circuit 315 may be implemented with only the delay elements 700(1) and 700(2). The delay element 700(1) receives a clock input signal, and the delay elements 700(1) to 700(4) determine the amount of delay provided to the clock input signal. The delay element 700(4) outputs the feedback clock signal Fbkclk with a phase determined by the delay provided by delay elements 700(1) to 700(4). Each pair of delay elements (e.g., delay elements 700(1) and 700(2)) may provide a delay value of, for example, approximately T/4 wherein T is defined as the clock period of the reference clock signal Refclk.

The delay chain and anti-aliasing circuit 315 further includes an inverter 705 and a D-type Flip-Flop 710. The inverter 705 inverts the clock input signal, provides a delay of T/2 to the clock input signal, and generates the reference clock signal Refclk. The Flip-Flop 710 includes a data input terminal "D" for receiving a clock signal 1005 (i.e., the clock input signal with added delay), a clock input terminal "ck" for receiving the reference clock signal Refclk, and an output terminal "Q" for generating the GATE signal.

Figure 13A:
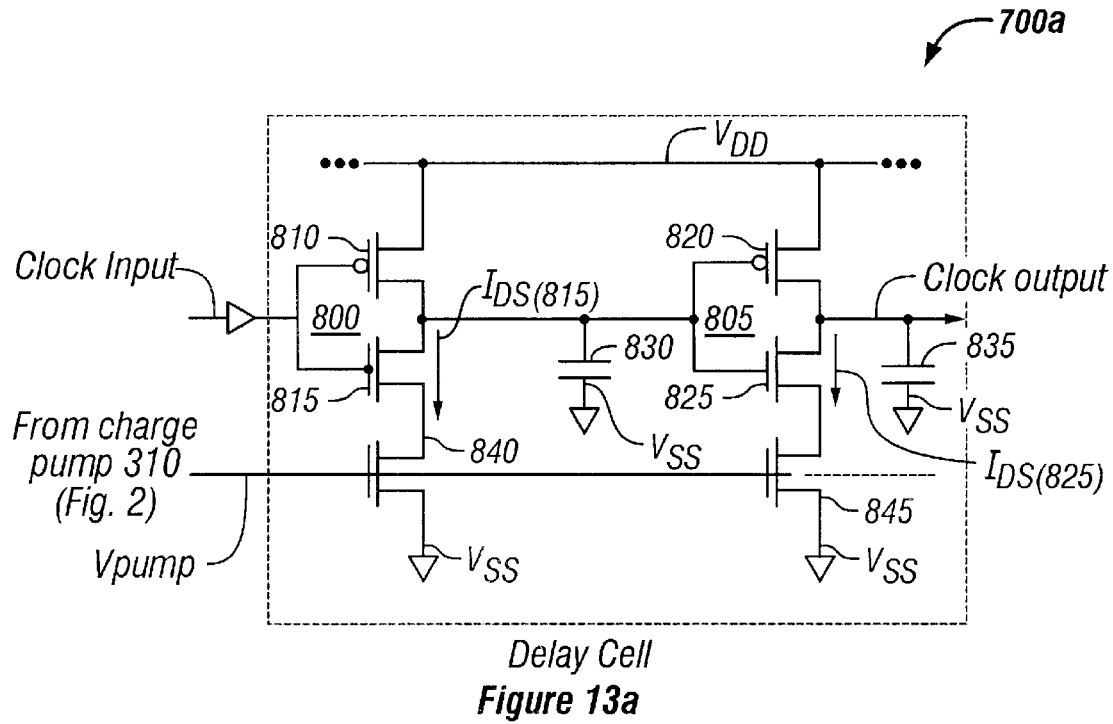
FIG. 13a is a schematic circuit diagram of an embodiment of the delay cell in FIG. 12.

FIG. 13*a* is a schematic circuit diagram of a delay cell 700*a* in accordance with an embodiment of the present invention. The delay cell 700*a* may be used to implement any of the delay cells 700(1) to 700(4) in FIG. 12. The delay cell 700*a* includes an inverter 800 for receiving an input clock signal (e.g., the reference clock signal Refclk) and an inverter 805, coupled to the output of inverter 800, for generating an output clock signal (e.g., an output clock signal P1 which is generated as an output of delay chain and anti-aliasing circuit 305). The inverter 800 includes p-channel transistor 810 and n-channel transistor 815, while the inverter 805 includes the p-channel transistor 820 and the n-channel transistor 825. The VDD voltage source is coupled to the sources of p-channel transistors 810 and 820. A capacitive load 830 is coupled to the drains of p-channel transistor 800 and n-channel transistor 815, while a capacitive load 835 is coupled to the drains of p-channel transistor 820 and n-channel transistor 825.

The delay cell 700*a* further includes an n-channel transistor 840 with a drain coupled to the source of n-channel transistor 815, a source coupled to ground (VSS) and a gate for receiving the control signal Vpump from the charge pump 310 (FIG. 3). An n-channel transistor 845 has a drain coupled to the source of n-channel transistor 825, a source coupled to ground,(VSS) and a gate for receiving the control signal Vpump from the charge pump 310 (FIG. 3). The n-channel transistors 840 and 845 serve as variable resistors that affect the switching speed of the inverters 800 and 805, respectively. The value of the control signal Vpump determines the resistance provided by the n-channel transistors 840 and 845. Thus, if the value of the control signal Vpump is low, then the resistance provided by the n-channel transistor 840 (or n-channel transistor 845) is high. As the value of the control signal Vpump increases, then the resistance provided by the n-channel transistor 840 (or n-channel transistor 845) decreases.

As the resistance value provided by n-channel transistor 840 increases, the resistance value at the drain of n-channel transistor 815 increases. As a result, the value of $I_{DS(815)}$ (drain-to-source current of transistor 815) decreases. As the value of $I_{DS(815)}$ decreases, the switching speed of inverter 800 decreases, thereby adding delay to the clock input signal (Refclk) received by the delay cell 700*a*. Conversely, as the value of $I_{DS(815)}$ increases (by decreasing the resistance provided by n-channel transistor 840), the switching speed of inverter 800 increases, thereby decreasing the delay provided to the clock input signal (Refclk) received by the-delay cell 700*a*.

Similarly, the resistive value provided by n-channel transistor 845 depends on the value of the control signal Vpump from the charge pump 310 (FIG. 3). As the resistive value provided by n-channel transistor 845 increases, the value of $I_{DS(825)}$ (drain-to-source current of transistor 825) decreases, the switching speed of inverter 805 decreases, thereby increasing the delay provided to the clock signal Refclk received by the delay cell 700*a*. As the resistive value provided by n-channel transistor 845 decreases, the value of $I_{DS(825)}$ increases, the switching speed of, inverter 805 increases, thereby decreasing the delay provided to the clock signal Refclk received by the delay cell 700*a*.

Figure 13B:
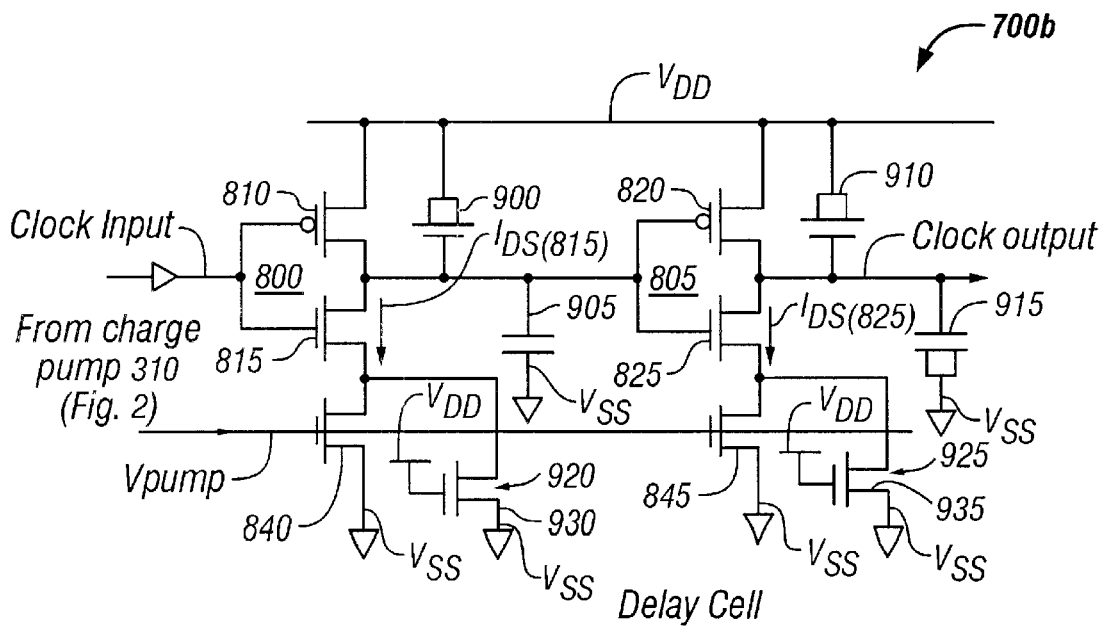
FIG. 13b is a schematic circuit diagram of another embodiment of the delay cell in FIG. 12.

FIG. 13*b* is a schematic circuit diagram of a delay cell 700*b* in accordance with another embodiment of the present invention. The delay cell 700*b* may also be used to implement any of the delay cells 700(1) . . . 700(n) in FIG. 12. The delay cell 700*b* includes a capacitor 900 coupled between VDD and the drains of p-channel transistor 810 and n-channel transistor 815. The delay cell 700*b* also includes a capacitor 905 coupled between VSS and the drains of p-channel transistor 810 and n-channel transistor 815. The capacitor 905 may be implemented by an n-channel transistor.

Similarly, a capacitor 910 is coupled between VDD and the drains of p-channel transistor 820 and n-channel transistor 825. The capacitor 910 may also be implemented by a p-channel transistor. A capacitor 915 is coupled between VSS and the drains of p-channel transistor 820 and n-channel transistor 825. The capacitor 915 may also be implemented by an n-channel transistor.

The delay cell 700*b* further includes delay paths 920 and 925. The delay path 920 includes an n-channel transistor 930 with a gate coupled to VDD, a source coupled to VSS, and a drain coupled to the drain of n-channel transistor 840 and the source of n-channel transistor 815. The delay path 925 includes an n-channel transistor 935 with a gate coupled to VDD, a source coupled to VSS, and a drain coupled to the drain of n-channel transistor 845 and the source of n-channel transistor 825.

The operation of the leakage paths 920 and 925 are now described. When the value of Vpump is at a low level, the resistance value of n-channel transistor 840 and/or 845 is at high level. As a result, the capacitors 905 and 915 will be unable to discharge via n-channel transistors 840 and 845, respectively. If the n-channel transistors 840 and 845 are unable to discharge, then the leakage paths 920 and 925 permit the currents $I_{DS(815)}$ and $I_{DS(825)}$, respectively, to discharge to VSS. Since the currents $I_{DS(815)}$ and $I_{DS(825)}$ can discharge, the inverters 800 and 805 are able to switch their outputs from a high level to a low level.

Figure 1A:
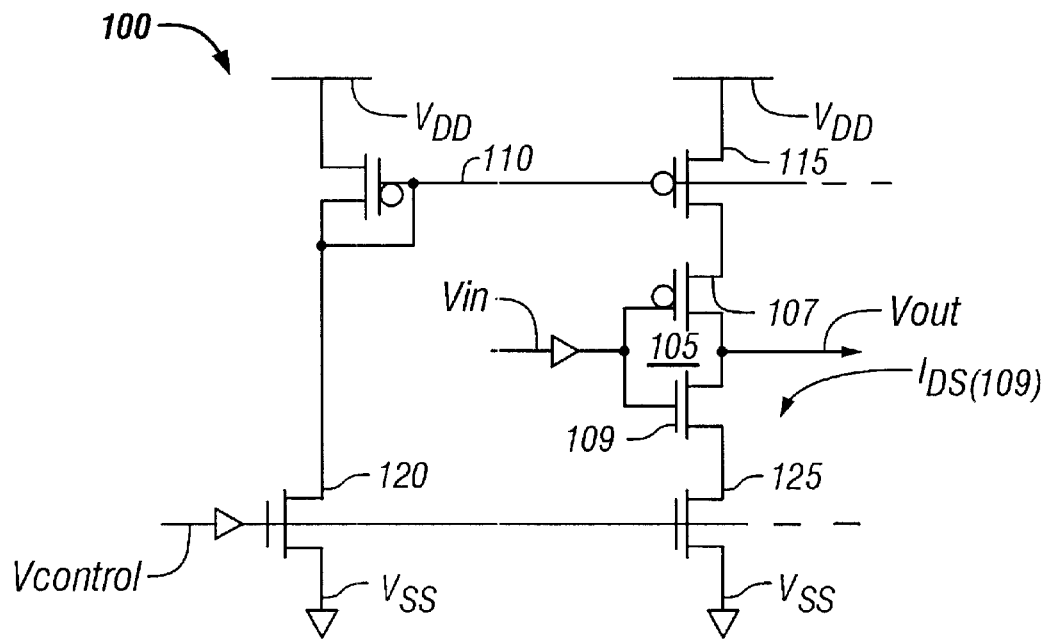
FIG. 1a is a schematic circuit diagram of a conventional delay cell based on the current-starved approach.
Figure 1B:
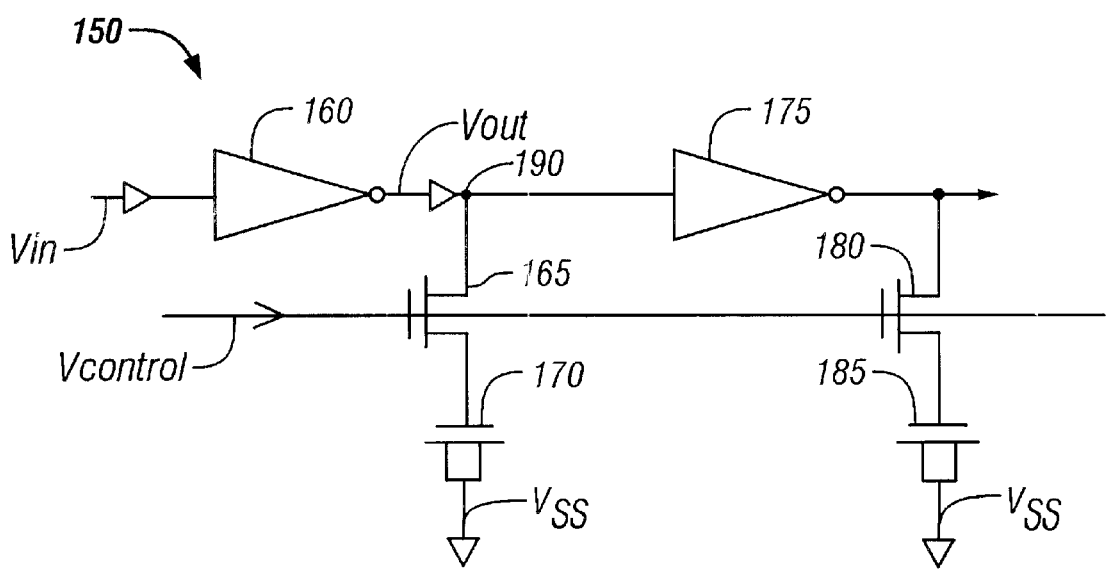
FIG. 1b is a schematic circuit diagram of a conventional delay cell based on the shunt-capacitor approach.

The advantages of the delay cells in FIGS. 13*a* and 13*b* include the following. The resistance value provided by n-channel transistors 840 and 845 can have a wide range, since Vpump can have a wide range of values. In addition, the delay cells in FIGS. 13*a* and 13*b* avoids the soft breakdown problems of some conventional approaches, since the delay cells are not bootstrapped above VDD. Furthermore, the delay cells may be implemented by current CMOS process. Additionally, the noise margin and power supply rejection, which is a measure of noise rejection from supply, is superior to those of the conventional current starved delay cells, since the delay cells in FIGS. 13*a* and 13*b* have outputs that are rail-to-rail. The conventional current-starved delay cells have smaller output amplitude due to the voltage drops in the current mirrors. (transistors 115 and 125 in FIG. 1a)

The operation is now described for the delay locked loop in accordance with an embodiment the present invention. In particular, the operation of the delay locked loop is described during power-up/reset of the delay locked loop 300, during phase locking without the occurrence of an aliased signal, and during phase locking with the occurrence of an aliased signal.

Power-Up and Reset

During power-up or reset of the delay locked loop in accordance with the present invention, the Flip-Flop 710 (FIG. 12) receives a "power on" ("reset") signal, thereby causing the GATE signal to be low. Since the GATE signal is low, the outputs of NAND gates 410, 415, 425, and 440 (FIG. 7) are high. The NAND gates 425 and 430 are cross-coupled. As a result, since the output of NAND gate 425 is high, the output of NAND gate 430 is low. The NAND gates 435 and 440 are cross-coupled. As a result, since the output of NAND gate 440 is high, the output of NAND gate 435 is low. Since the NAND gate 445 is receiving the low output of NAND 420, the NAND gate 445 has a high output. In addition, since NAND gate 455 is receiving the low output of NAND gate 420, the output of NAND gate 455 is high.

The NAND gate 420 receives the high output signals from NAND gates 410 and 455 and the high VDD signal. As a result, the output of NAND gate 420 is low. The high output of NAND gate 455 is also inverted into a low PUMP DOWN signal by inverter 457.

The NAND gate 450 is receiving the high outputs of NAND gates 415, 425, and 445. As a result, the NAND gate 450 outputs a low signal. This low signal is then inverted into a high PUMP UP signal through the inverter 458. This shows how the phase detector is reset during Power-Up sequence into a PUMP UP condition.

Referring now to FIG. 11, the NAND gate 610 outputs a high signal, since NAND gate 610 is receiving the high PUMP UP signal and a low output from inverter 605. The high output of NAND gate 610 is inverted by inverter 615 into a low signal for disabling the current source 620. The NAND gate 625 outputs a high signal, since NAND gate 625 is receiving the low PUMP DOWN signal and the low output from inverter 605. The high output of NAND gate 625 is inverted by inverter 630 into a low signal for disabling the current source 635.

The low GATE signal is received by the inverter 600, and inverted into a high signal for turning on the n-channel transistor 640. Since the n-channel transistor 640 is on, the capacitor 645 is coupled to and charged by the VDD voltage source. As a result, the control voltage Vpump is charged to a high level. The size of n-channel transistor 640 is variable. For example, the size of n-channel transistor 640 may be increased so that Vpump is pulled to a high level at a faster rate.

Referring now to FIGS. 13a and 13b, the high control voltage Vpump value decreases the resistance provided by the n-channel transistors 840 and 845. The capacitive load 830 can discharge via n-channel transistor 840 to ground or VSS. As a result, during power-up or reset of the delay locked loop 300, the clock delay provided by the delay cell 700a (or 700b) is minimized.

Phase Locking without the Occurrence of Aliased Signals

Figure 14A:
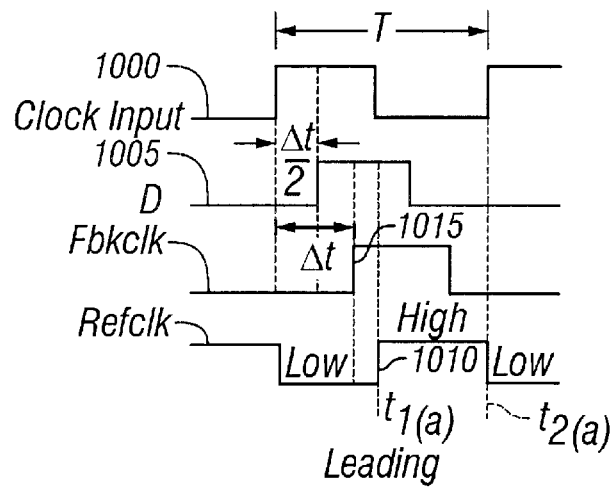
FIG. 14a is a timing diagram illustrating a condition of the feedback clock signal Fbkclk leading the reference clock signal Refclk.
Figure 14B:
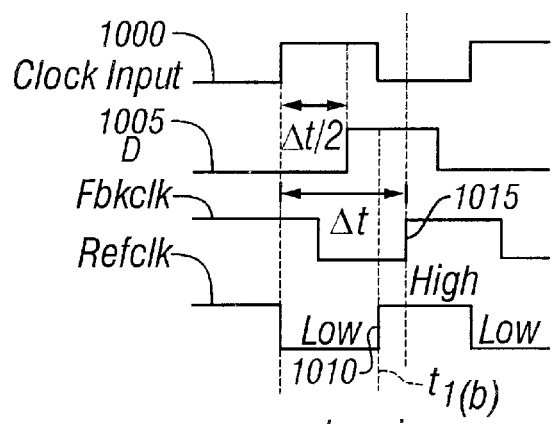
FIG. 14b is a timing diagram illustrating a condition of the feedback clock signal Fbkclk lagging the reference clock signal Refclk.

Reference is now made to FIGS. 6, 7, 11, 12, and 14b for discussion of the operation of the delay locked loop 300 if the feedback clock signal Fbkclk initially lags the reference clock signal Refclk. Referring first to FIGS. 12 and 14b, the waveform 1000 (FIG. 14b) is the clock input signal received by the. delay element 700(1) (FIG. 12), while the waveform 1005 is the delayed clock input signal received by the input terminal D of Flip-Flop 710. Assume further that the total delay Δt provided to the clock input signal 1000 by the delay chain and anti-aliasing circuit 315 is less than T which is the clock period of the reference clock signal Refclk. Thus, in the example shown in FIG. 14b, the delay elements 700(1) and 700(2) delay the clock input signal 1000 by Δt/2 and the delay element 700(2) outputs the delayed signal 1005, while the delay elements 700(1) to 700(4) delay the clock input signal 1000 by Δt. The delay element 700(4) outputs the delayed signal Fbkclk. At time t1(b), the waveform 1005 (which is received by the data input D of Flip-Flop 710) is high, while a rising edge 1010 (FIG. 14b) of the reference clock signal Refclk is received by the clock input ck of Flip-Flop 710 (FIG. 12). Therefore, the value of the GATE signal at the output Q of Flip-Flop 710 will be high after the clock input ck receives the rising edge 1010.

As the Refclk changes its state from low to high in FIG. 14b, the NAND gate 415 will output high. As a result. the NAND gate 450 outputs low and the PUMP UP signal becomes high through the inverter 458. On the other hand, the clock signal Fbkclk stays at low, and the NAND gate 420 will not change its low state. The NAND gate 455 outputs high which forces the inverter 457 to provide a low PUMP DOWN signal.

When Fbkclk goes high after certain time delay shown in FIG. 14b, the NAND gate 420 will change from a low state into a high state. At this moment, the NAND gate 455 will go low and the NAND gate 445 will go low after the gate delay of the NAND gate 445. The low signal from the NAND gate 455 is inverted through the inverter 457 and provides a high PUMP DOWN signal. At the same time, the low signal from the NAND gate 445 will reset the NAND gates 430, 435, 450, and 455 to the high state. Therefore, the PUMP DOWN signal will go high for a short period of time and then return to its low state. The PUMP UP signal will also return to the low state due to the reset signal from the NAND gate 445. The result is shown in FIG. 5.

Referring now to FIG. 11, the NAND gate 610 receives the high PUMP UP signal and the high inverter 605 output. As a result, the NAND gate 610 generates a low signal and the inverter 615 generates a high signal that enables the current source 620. The enabled current source 620 then charges the capacitor 645 to a higher level, thereby incrementing the value of Vpump. The NAND gate 625 receives the low PUMP DOWN signal. As a result, the NAND gate 625 generates a high signal and the inverter 630 generates a low signal that disables the current source 635. Since current source 635 is disabled, it is unable to drains current from the capacitor 645 and the Vpump voltage value does not decrease.

As long as Fbkclk is lagging Refclk, the phase detector 305 generates a high PUMP UP signal for increasing the value of Vpump, as described above. As the value of Vpump increases, the resistance provided by n-channel transistors 840 and 845 (see FIG. 13a or 13b) decreases. Therefore, the switching speed of inverters 800 and 805 (FIG. 13a or 13b) increases, and delay is decreased for the clock input signal (FIG. 13a or 13b). Thus, the speed of clock output signal (FIG. 13a or 13b) increases wherein the clock output signal may be the Fbkclk signal. The speed of the clock output signal (or Fbkclk signal) is increased until Fbkclk is in phase with Refclk, as shown in FIG. 6.

Reference is now made to FIGS. 7 and 14a to describe a condition when Fbkclk is initially leading the Refclk signal.

In the example of FIG. 14a, assume that the total delay Δt provided to Fbkclk is less than the clock period T of Refclk. At time t1(a), the value of waveform 1000 (received at input D of Flip-Flop 710) is high. Therefore, when the rising edge 1010 occurs during time t1(a), the GATE signal generated from output Q of Flip-Flop 710 is high.

In the example of FIG. 14a, the Fbkclk clock signal is leading the Refclk clock signal, and at a time just before t1(a), the feedback clock signal Fbkclk is high. Since the NAND gate 410 is receiving the high GATE signal and the high Fbkclk signal, the NAND gate 410 will output a low signal. The NAND gate 420 outputs a high signal, since it is receiving the low NAND gate 410 output. The NAND gate 440 receives the high NAND gate 420 output and the low NAND gate 435 output. It will remain at the high state. The NAND gate 455 will output low since all three inputs are at high state. Therefore, the PUMP DOWN signal will go high. However, the NAND gate 445 will reset the NAND gates 430, 435, 450, and 455 to the high state after the gate delay of the NAND gate 445. Both PUMP UP and PUMP DOWN signals will go low. After the reset, since both NAND gates 450 and 455 output high, the NAND gates 415 and 420 output low. When both Refclk and Fbkclk are low, the NAND gates 430 and 435 will go low, and the NAND gate 425 and 440 will go high. At this moment, the NAND gates 415 and 420 are ready to receive the next rising edge from inputs Refclk and Fbkclk, respectively. If the Fbkclk clock signal is leading the Refclk clock signal, the NAND gate 420 will go high when Fbkclk goes high. This will cause the PUMP DOWN signal to go high. Since the NAND gate 415 output low, the reset NAND gate 445 will stay high. When the Refclk clock signal changes state from low to high, the NAND gate 415 will output high. This will in turn cause the PUMP UP signal to go high. However, the reset NAND gate 445 will go low after a given gate delay and force both PUMP DOWN and PUMP UP signals to be low. This accomplishes the waveform shown in FIG. 4.

Referring now to FIG. 11, the NAND gate 610 receives the low PUMP UP signal. As a result, the NAND gate 610 generates a high signal and the inverter 615 generates a low signal that disables the current source 620. The NAND gate 625 receives the high PUMP DOWN signal and the high output generated by inverter 605. As a result, the NAND gate 625 generates a low signal and the inverter 630 generates a high signal that enables the current source 635. Therefore, the enabled current source 635 drains current from the capacitor 645 to VSS so that the Vpump voltage value decreases. It is further noted that the inverter 600 inverts the high GATE signal into a low output that turns off the n-channel transistor 640. As a result, the n-channel transistor 640 is unable to pull Vpump to the VDD value.

As long as Fbkclk is leading Refclk, the phase detector 305 generates a high PUMP DOWN signal for decreasing the value of Vpump, as described above. As the value of Vpump decreases, the resistance provided by n-channel transistors 840 and 845 (see FIG. 13a or 13b) increases. Therefore, the switching speed of inverters 800 and 805 (FIG. 13a or 13b) decreases, and delay is added to the clock input signal (FIG. 13a or 13b). Thus, the clock output signal (FIG. 13a or 13b) is slowed down wherein the clock output signal may be the Fbkclk signal. The process will continue until Fbkclk is in phase with Refclk, as shown in FIG. 6.

Phase Locking with the Occurrence of Aliased Signals

An aliased signal will typically occurs when the overall delay provided to the delay locked loop output clock signal (i.e., the feedback clock signal Fbkclk) is lagging the reference clock signal Refclk by more than one clock period T of the reference clock. Due to the aliased condition, the phase detector in the delay locked loop will be unable to determine if the feedback clock signal Fbkclk is lagging or leading the reference clock signal Refclk. In particular, the phase detector will detect rising edges 1020 and 1025 and will be unable to determine the relative phases between Refclk and Fbkclk based on rising edges 1020 and 1025.

Figure 14C:
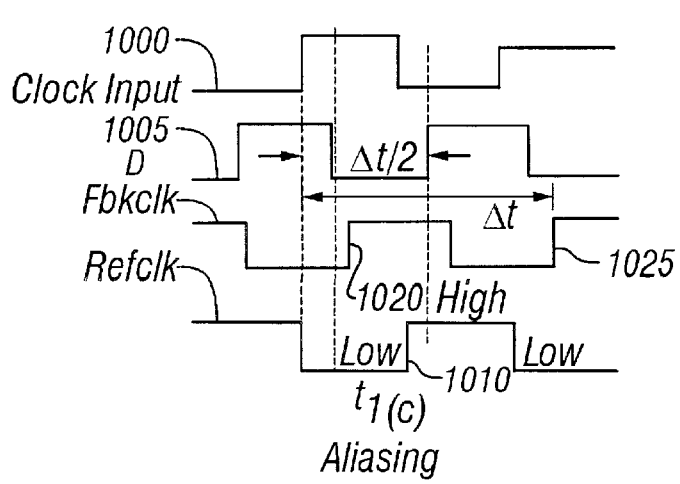
FIG. 14c is a timing diagram illustrating an aliased condition.

As shown in FIG. 14c, the waveform 1005 (at input D of Flip-Flop 710) is low. Therefore, when the rising edge 1010 of Refclk occurs during time t1(c) the Flip-Flop 710 outputs a low GATE signal. The low GATE signal is received by the phase detector 305 and the charge pump 310. As similarly described above, the low GATE signal disables the PUMP UP and PUMP DOWN signal from phase detector 305 and enables the capacitor 645 to be charged to (VDD-VTH), where VTH is the threshold voltage of the n-channel transistor 640. As Vpump is raised toward (VDD-VTH), the resistance provided by n-channel transistors 815 and 825 is reduced. At the same time, the phase detector is reset into a PUMP UP condition as described in the Power-Up section even after the GATE signal goes to a normal high state. The clock speed of Fbkclk is, therefore, increased, thereby eliminating the aliased condition since the Fbkclk will no longer lag Refclk by more than one clock period T.

Figure 15:
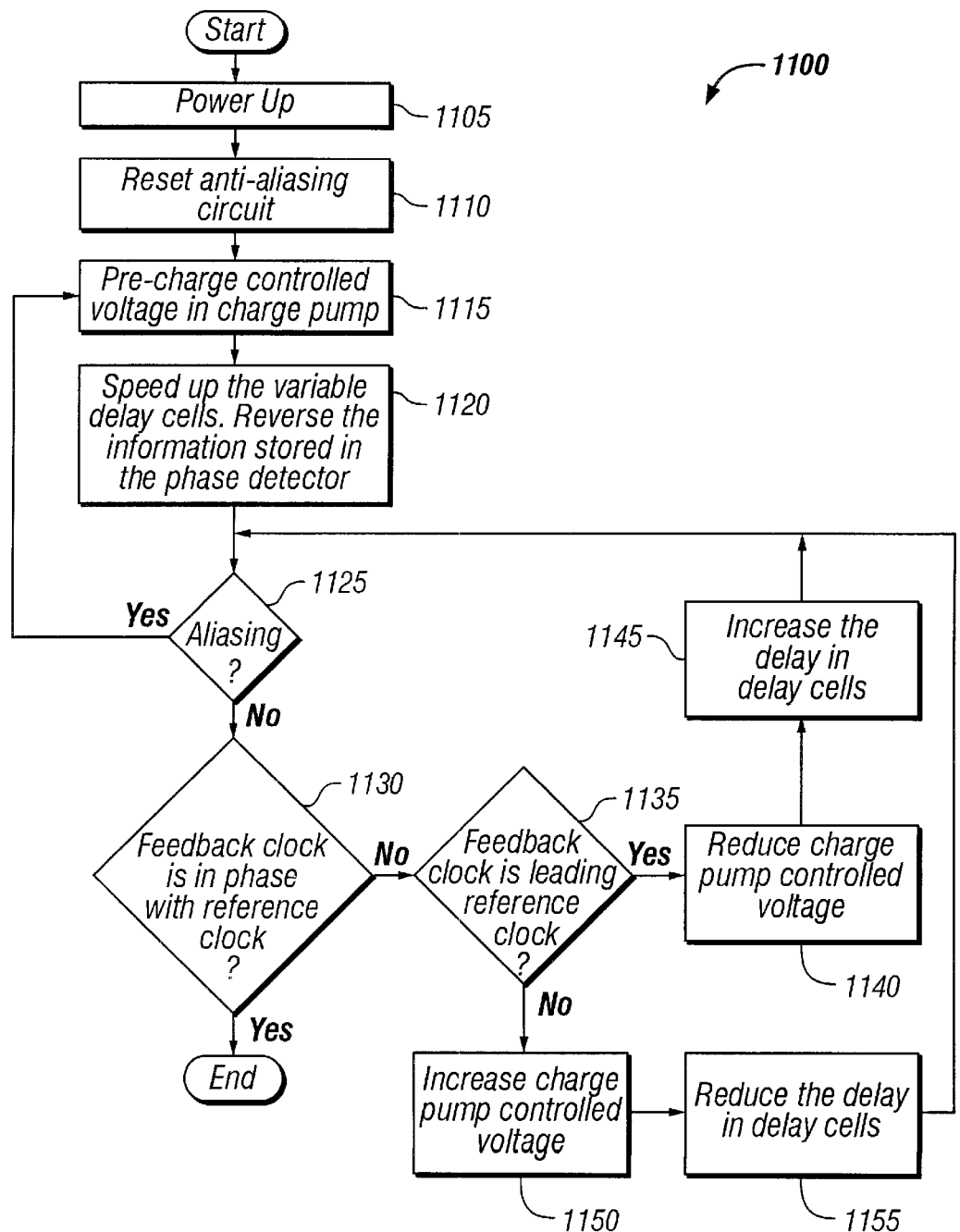
FIG. 15 is a flowchart illustrating the operation of a delay locked loop in accordance with an embodiment of the present invention.

Referring now to FIG. 15, a flowchart 1100 illustrates the operation of a delay locked loop in accordance with the present invention. The delay locked loop is initially powered up 1105, as shown in FIG. 15. The Flip-Flop 710 of an anti-aliasing circuit in accordance with the present invention is then reset 1110. As a result of the reset 1110, the control voltage Vpump is precharged 1115 to a high level. The high Vpump level increases 1120 the speed of the clock signals generated by the delay cells 700(1) to 700(4).

A check 1125 for aliasing occurrence is then performed. If aliasing occurs, then the control voltage Vpump is again charged 1115 to a high level, thereby increasing 1120 to speed up the clock signals generated by delay cells 700(1) to 700(4) and eliminating the alias condition.

If the alias condition has been eliminated, then a check 1130 is made to determine if the feedback clock signal Fbkclk is in phase with the reference clock signal Refclk. If Fbkclk and Refclk are in phase, then the operation of the delay locked loop ends. Otherwise, a check 1135 is made to determine if Fbkclk is leading or lagging Refclk. If Fbkclk is leading Refclk, then the control voltage Vpump is reduced in value, thereby increasing 1145 the delay provided by the delay cells 700(1) to 700(4) to Fbkclk. The check 1125 for aliasing and the subsequent steps mentioned above are again performed until Fbkclk is in phase with Refclk.

If Fbkclk is lagging Refclk, then the value of Vpump is increased 1150, thereby reducing 1155 the delay provided by delay cells 700(1) to 700(4) to Fbkclk. The check 1125 for aliasing and the subsequent steps mentioned above are again performed until Fbkclk is in phase with Refclk.

What is claimed is:

1. A delay cell comprising:
   a first inverter and a second inverter, each including an input and an output;
   capacitor load connected to the output of the first inverter; the input of the second inverter coupled to the output of the first inverter;
   a first transistor coupled to the first inverter to provide a resistive value for controlling current flow in the capacitive load to alter switching speed of the first inverter in response to a control signal applied to a gate input of the first transistor; and
   a second transistor coupled to the second inverter to provide a resistive value for controlling switching speed of the second inverter in response to a control signal applied to a gate input of the second transistor.

2. The delay cell of claim 1, further comprising:

a leakage path coupled to the first inverter and capable of conducting capacitor load current through the first inverter, said leakage path including a transistor having first and second electrodes forming a conduction path, and including a gate input coupled to a source of reference voltage for controlling current flowing in the conduction path;

wherein the gate input of the first transistor to which the control signal is applied is isolated from the input of the first inverter.

3. The delay cell of claim 2 further comprising:

a second leakage path including a second transistor coupled to the second inverter for conducting current from the second inverter, and including a gate electrode coupled to a source of reference voltage.

* * * * *